(12) United States Patent
Vogel et al.

(10) Patent No.: US 9,081,311 B2
(45) Date of Patent: Jul. 14, 2015

(54) LITHOGRAPHIC APPARATUS AND DEVICE MANUFACTURING METHOD

(75) Inventors: Herman Vogel, Sandy Hook, CT (US); Jeroen Gerard Gosen, Geldrop (NL); Bart Dinand Paarhuis, Waalre (NL); Frank Johannes Jacobus Van Boxtel, Eindhoven (NL); Jinggao Li, Fairfield, CT (US)

(73) Assignee: ASML NETHERLANDS B.V., Veldhoven (NL)

( * ) Notice: Subject to any disclaimer, the term of this patent is extended or adjusted under 35 U.S.C. 154(b) by 604 days.

(21) Appl. No.: 13/430,159

(22) Filed: Mar. 26, 2012

(65) Prior Publication Data

US 2012/0249983 A1 Oct. 4, 2012

Related U.S. Application Data

(60) Provisional application No. 61/468,339, filed on Mar. 28, 2011, provisional application No. 61/570,130, filed on Dec. 13, 2011.

(51) Int. Cl.
*G03B 27/62* (2006.01)
*G03B 27/64* (2006.01)
(Continued)

(52) U.S. Cl.
CPC ........ *G03F 7/70908* (2013.01); *G03F 7/70866* (2013.01)

(58) Field of Classification Search
CPC .................. G03F 7/70866; G03F 7/70908
USPC .......................................... 355/30, 53, 75, 76
See application file for complete search history.

(56) References Cited

U.S. PATENT DOCUMENTS

| | | | | |
|---|---|---|---|---|
| 4,648,106 A | * | 3/1987 | Novak | 378/34 |
| 5,877,843 A | * | 3/1999 | Takagi et al. | 355/30 |

(Continued)

FOREIGN PATENT DOCUMENTS

| | | |
|---|---|---|
| CN | 100570490 C | 12/2009 |
| EP | 1 098 225 | 5/2001 |

(Continued)

OTHER PUBLICATIONS

Japanese Office Action mailed Jun. 25, 2013 in corresponding Japanese Patent Application No. 2012-069038.

*Primary Examiner* — Minh-Toan Ton
*Assistant Examiner* — Deoram Persaud
(74) *Attorney, Agent, or Firm* — Pillsbury Winthrop Shaw Pittman LLP

(57) ABSTRACT

An apparatus, in an embodiment, having a patterning device support including a first planar element having a first flow-restricting surface; a second planar element including a second flow-restricting surface facing the first flow-restricting surface; a support driver to linearly move the support along a certain direction relative to the second planar element, wherein the first and/or second flow-restricting surface has one or more projections and/or recesses between the first and second flow-restricting surfaces, and wherein the projection and/or recess on the first and/or second flow-restricting surface is arranged to provide a flow resistance, per unit width of the first and/or second flow-restricting surface perpendicular to the flow, that is lower against flow that is parallel to the certain direction than against flow that is perpendicular to the certain direction. The flow-restricting surfaces may direct gas flow onto a driver part that generates heat.

20 Claims, 8 Drawing Sheets

(51) Int. Cl.
*G03B 27/52* (2006.01)
*G03F 7/20* (2006.01)

(56) References Cited

U.S. PATENT DOCUMENTS

| | | | | |
|---|---|---|---|---|
| 6,492,067 | B1* | 12/2002 | Klebanoff et al. | 430/5 |
| 6,542,220 | B1* | 4/2003 | Schrijver et al. | 355/53 |
| 6,987,278 | B2 | 1/2006 | Loopstra | |
| 7,130,017 | B2* | 10/2006 | Hof et al. | 355/30 |
| 7,230,673 | B2 | 6/2007 | Ten Kate | |
| 7,916,267 | B2 | 3/2011 | Auer | |
| 2001/0026355 | A1* | 10/2001 | Aoki et al. | 355/30 |
| 2002/0018190 | A1 | 2/2002 | Nogawa et al. | |
| 2002/0191166 | A1 | 12/2002 | Hasegawa et al. | |
| 2003/0136309 | A1 | 7/2003 | Shinozaki et al. | |
| 2003/0146396 | A1 | 8/2003 | Loopstra | |
| 2005/0074352 | A1* | 4/2005 | Luo et al. | 417/572 |
| 2005/0146696 | A1* | 7/2005 | Arakawa | 355/30 |
| 2006/0060259 | A1 | 3/2006 | Devitt | |
| 2006/0119808 | A1 | 6/2006 | Kate | |
| 2008/0055576 | A1 | 3/2008 | Auer | |
| 2009/0207394 | A1 | 8/2009 | Shibazaki | |
| 2010/0195074 | A1 | 8/2010 | Sogard | |
| 2011/0032495 | A1 | 2/2011 | Shibazaki | |
| 2012/0162628 | A1* | 6/2012 | Van Der Blij et al. | 355/72 |
| 2012/0224153 | A1* | 9/2012 | Ehm et al. | 355/30 |
| 2013/0010270 | A1* | 1/2013 | Van Boxtel et al. | 355/30 |
| 2013/0088694 | A1* | 4/2013 | Van Boxtel et al. | 355/30 |
| 2013/0088699 | A1* | 4/2013 | Yakunin et al. | 355/67 |
| 2014/0022524 | A1* | 1/2014 | Wegmann et al. | 355/67 |

FOREIGN PATENT DOCUMENTS

| | | |
|---|---|---|
| EP | 1 098 226 | 5/2001 |
| EP | 1 075 672 | 9/2002 |
| EP | 1 256 844 | 11/2002 |
| JP | 2001-168027 | 6/2001 |
| JP | 2003-004149 | 1/2003 |
| JP | 2007-189073 | 7/2007 |
| JP | 2009-210033 | 9/2009 |
| TW | 563002 | 11/2003 |
| TW | 200933309 | 8/2009 |
| WO | 2009/078422 | 6/2009 |

* cited by examiner

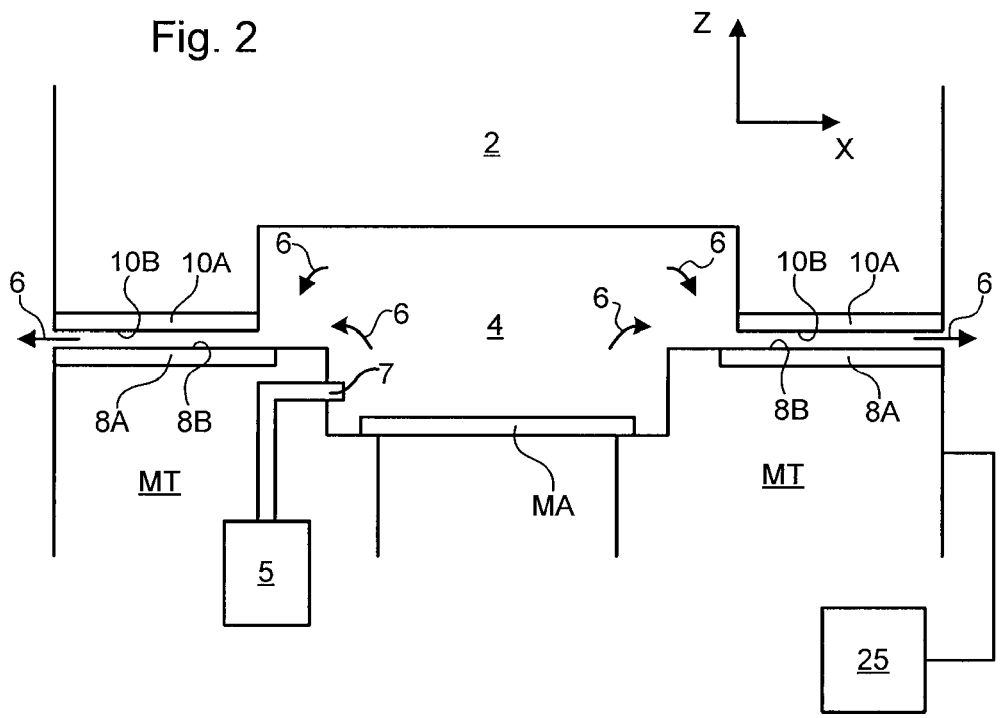
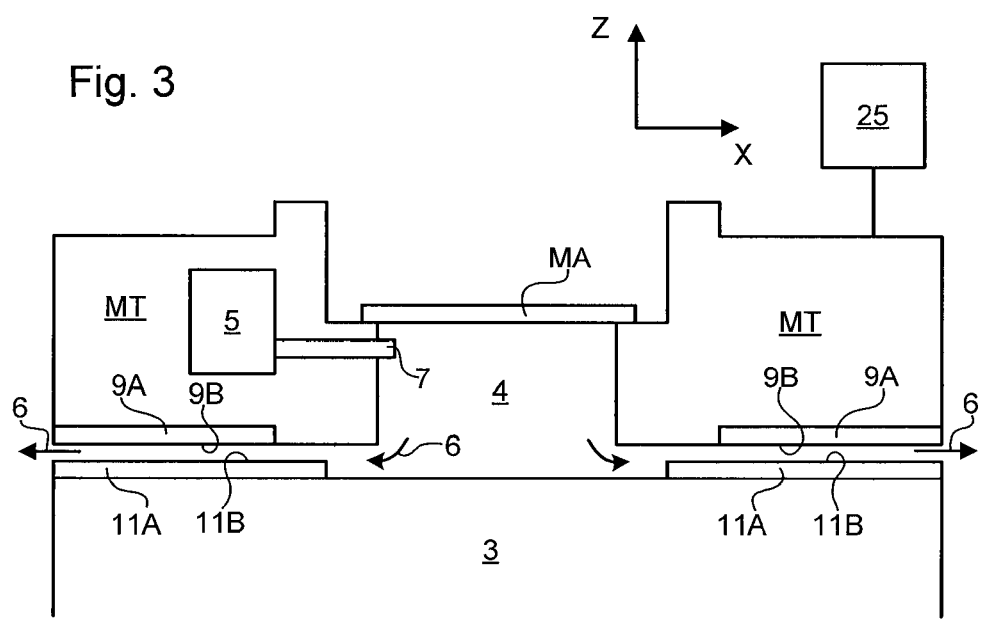

LITHOGRAPHIC APPARATUS AND DEVICE MANUFACTURING METHOD

This application claims priority and benefit under 35 U.S.C. §119(e) to U.S. Provisional Patent Application Ser. No. 61/468,339, entitled "Lithographic Apparatus and Device Manufacturing Method", filed on Mar. 28, 2011, and to U.S. Provisional Patent Application Ser. No. 61/570,130, entitled "Lithographic Apparatus and Device Manufacturing Method", filed on Dec. 13, 2011. The contents of those applications are incorporated herein in their entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

An internal gaseous environment in the region of the patterning device may be controlled to reduce or prevent contaminants and/or gas (e.g., air) with a variable property interfering with the radiation beam and/or sensitive elements of the patterning device. The internal gaseous environment will typically be substantially isolated from the region outside, but not perfectly sealed off. A gas supply system having an outlet into the internal gaseous environment may be provided and configured to maintain an overpressure in the internal gaseous environment. The overpressure drives a substantially constant flow of gas out of the internal gaseous environment. The substantially constant outward flow of gas helps to prevent inflow of contaminants. The substantially constant flow of gas may be channeled through a leaky seal, for example through opposed flow-restricting surfaces.

The patterning device support may be configured to be driven linearly in a certain direction. That direction may be perpendicular to the axis of the projection system, which is referred to as the Z-axis. The direction may be referred to as the Y-direction.

Movement of the support may increase the level of contamination of the internal gaseous environment. For example, movement of the support can increase the extent to which contaminants breach the seal provided by the opposed flow-restricting surfaces. Movement of the support may lead to undesirable variation in the gaseous environment outside the internal gaseous environment. Such variation may interfere with one or more devices to measure the position of the support. Flow-restricting surfaces to control the flow of gas out of the internal gaseous environment may contribute to overheating of a system (e.g., magnet system) to drive movement of the support.

It is desirable, for example, to provide an arrangement which addresses one or more of the above-described problems, or an entirely different problem, associated with movement of the support.

According to an aspect of the invention, there is provided a lithographic apparatus comprising: a support constructed to support a patterning device, the patterning device being capable of imparting a radiation beam with a pattern in its cross-section to form a patterned radiation beam, the support comprising a first planar element having a first flow-restricting surface; a projection system configured to project the patterned radiation beam onto a target portion of a substrate; a second planar element comprising a second flow-restricting surface facing the first flow-restricting surface; a support driver to drive movement of the support relative to the second planar element, wherein the first flow-restricting surface, the second flow-restricting surface, or both the first and second flow-restricting surfaces, comprises a projection and/or recess between the first and second flow-restricting surfaces, wherein the support driver is configured to drive the support linearly along a certain direction relative to the second planar element, and wherein the projection and/or recess on the first and/or second flow-restricting surface is arranged to provide a flow resistance, per unit width of the first and/or second flow-restricting surface perpendicular to the flow, that is lower against flow that is parallel to the certain direction than against flow that is perpendicular to the certain direction.

According to an aspect of the invention, there is provided a lithographic apparatus comprising: a support constructed to support a patterning device, the patterning device being capable of imparting a radiation beam with a pattern in its cross-section to form a patterned radiation beam, the support comprising a first planar element having a first flow-restricting surface; a projection system configured to project the patterned radiation beam onto a target portion of a substrate; a second planar element comprising a second flow-restricting surface facing the first flow-restricting surface; a support driver to drive movement of the support relative to the second planar element; and a gas supply system configured to supply gas to an internal gaseous environment in the region of the patterning device, wherein the lithographic apparatus is configured such that a flow of gas out of the internal gaseous environment passes through a gap between the first and second flow-restricting surfaces, and the first and second flow-restricting surfaces are arranged to direct at least a portion of the flow of gas onto a component of the support driver that generates heat during use.

According to an aspect of the invention, there is provided a device manufacturing method comprising: supporting a patterning device using a support, the patterning device being capable of imparting a radiation beam with a pattern in its cross-section to form a patterned radiation beam, the support comprising a first planar element having a first flow-restricting surface; moving the support and the first planar element relative to a second, planar element, the second planar element comprising a second flow-restricting surface facing the first flow-restricting surface; and projecting the patterned radiation beam onto a target portion of a substrate, wherein the first flow-restricting surface, the second flow-restricting surface, or both the first and second flow-restricting surfaces, comprises a projection and/or recess in a gap between the first and second flow-restricting surfaces, wherein the support is moved linearly along a certain direction relative to the second planar element, and wherein the projection and/or recess on the first and/or second flow-restricting surface is arranged to provide a flow resistance, per unit width of the first and/or second flow-restricting surface perpendicular to the flow, that is lower against flow that is parallel to the certain direction than against flow that is perpendicular to the certain direction.

According to an aspect of the invention, there is provided a device manufacturing method comprising: supporting a patterning device using a support, the patterning device being capable of imparting a radiation beam with a pattern in its cross-section to form a patterned radiation beam, the support comprising a first planar element having a first flow-restricting surface; moving the support and the first planar element relative to a second planar element, the second planar element comprising a second flow-restricting surface facing the first flow-restricting surface; supplying gas to an internal gaseous environment in the region of the patterning device; using the first and second flow-restricting surfaces to direct a flow of gas out of the internal gaseous environment onto a component of a support driver that moves the support and that is generating heat; and projecting the patterned radiation beam onto a target portion of a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts an internal gaseous environment and first and second planar elements on an upper side of the support for the patterning device;

FIG. 3 depicts an internal gaseous environment and first and second planar elements on a lower side of the support;

DETAILED DESCRIPTION

Figure 1:
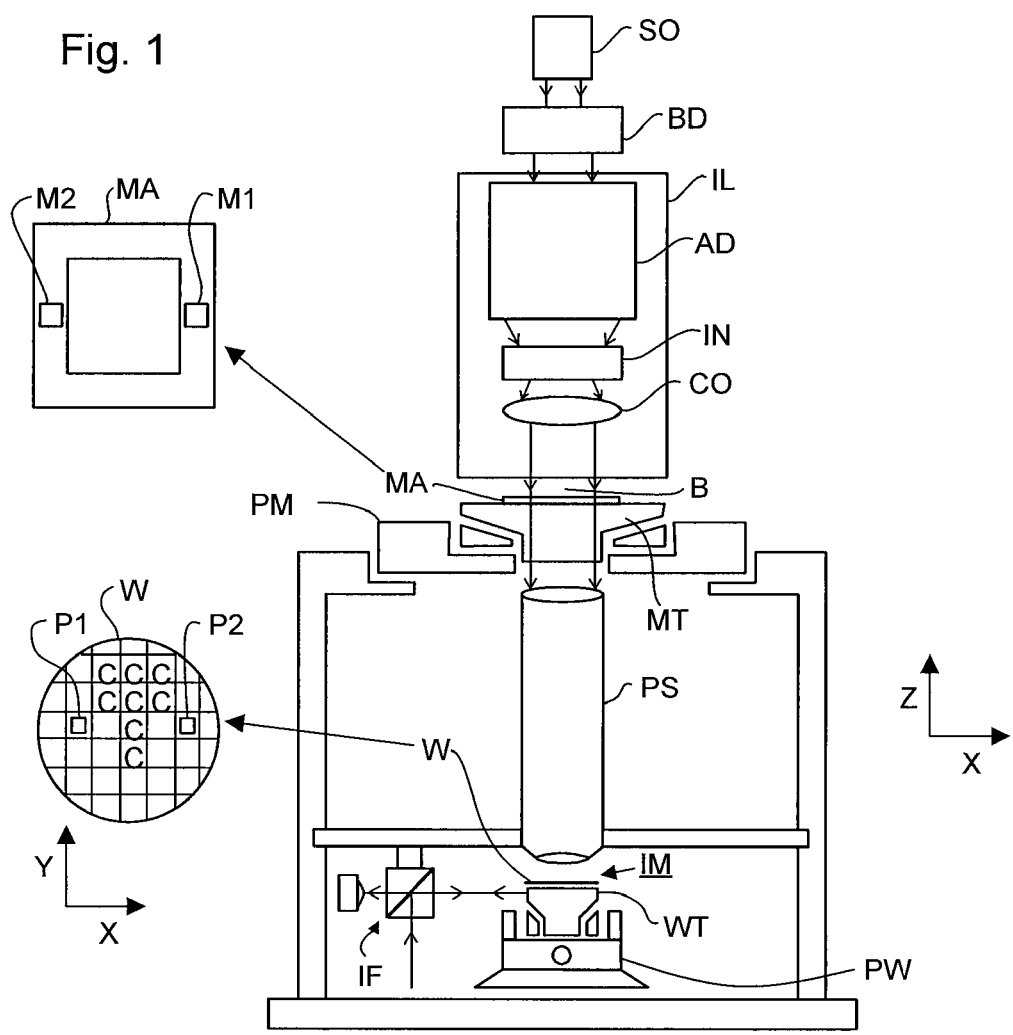
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, catadioptric, magnetic, electromagnetic, electrostatic or other types of optical components, or any combination thereof, for directing, shaping, or controlling radiation.

The support structure MT holds the patterning device MA. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stages or supports), e.g. two or more substrate tables or a combination of one or more substrate tables and one or more sensor or measurement tables. In such "multiple stage" machines the additional tables may be used in parallel, or preparatory steps may be carried out on one or more tables while one or more other tables are being used for exposure. The lithographic apparatus may have two or more patterning devices (or stages or supports) which may be used in parallel in a similar manner to substrate, sensor and measurement tables.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not exclusively mean that a structure, such as a substrate, must be submerged in liquid, but rather that liquid can be located between the projection system and the substrate and/or mask during exposure. This may or may not involve a structure, such as a substrate, being submerged in liquid. Reference sign IM shows where apparatus for implementing an immersion technique may be located. Such apparatus may include a supply system for the immersion liquid and a liquid confinement structure to contain liquid in the region of interest. Such apparatus may optionally be arranged so that the substrate table is fully covered by the immersion liquid.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, as in other modes, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As mentioned above, it is desirable to maintain a controlled internal gaseous environment in the region of the patterning device MA (above and/or below the patterning device MA).

FIG. 2 depicts an embodiment showing how control of an internal gaseous environment 4 can be achieved in a region above the support MT. The internal gaseous environment 4 in this example is located between the patterning device MA and support MT on one side, and a final element (and surrounding hardware) 2 of the illumination system IL on the other side. The internal gaseous environment 4 depicted is thus a volume through which the radiation beam passes before it encounters the patterning device MA.

In this example, a gas supply system 5 is provided to supply gas via an outlet 7 to the internal gaseous environment 4. The gas may be supplied with a controlled composition and/or at a controlled flow rate. Optionally, an overpressure is maintained within the internal gaseous environment 4. The overpressure results in an outward flow of gas, as shown schematically by arrows 6. The gas supply system 5 and/or outlet 7 may be mounted within the patterning device support MT (as shown) and/or within an element above and/or below the patterning device support MT. For example, the gas supply system 5 and/or outlet 7 may be mounted within or on a final element 2 of the illumination system IL. Alternatively or additionally, the gas supply system 5 and/or outlet 7 may be mounted within or on a first element 3 of the projection system PS.

The spatial distribution of flows/velocities can be controlled by first and second planar elements 8A, 10A. The first planar element 8A is such as to present a first flow-restricting surface 8B. The second planar element 10A is such as to present a second flow-restricting surface 10B. The planar elements 8A,10A are typically configured such that the first and second flow-restricting surfaces 8B, 10B are generally planar (i.e. planar within standard engineering tolerances and disregarding the deliberately formed projections and/or recesses discussed below). Either or both of the planar elements 8A, 10A may be formed as a separate element and attached to a component of the lithographic apparatus (e.g. the support MT in the case of the first planar element 8A). Alternatively or additionally, either or both of the planar elements 8A, 10A may be formed as an integral part of another component. Either or both of the planar elements 8A, 10A may comprise two substantially parallel, planar surfaces that are spaced apart from each other parallel to the Z-axis. Alternatively, either or both of the planar elements 8A, 10A may comprise only a single planar surface (which would be the flow-restricting surface 8B, 10B in this case).

The flow-restricting surfaces 8B, 10B face each other and are configured to resist inward and outward gas flow through the gap between them. Resisting inward gas flow helps to reduce contamination of the internal gaseous environment 4. Resisting outward gas flow helps the gas supply system 5 maintain a substantially stable overpressure in the internal gaseous environment 4. The flow-restricting surfaces 8B, 10B also present a relatively small gap through which the outflow of gas passes. This results in an increase in velocity of the outflow of gas. The increase in velocity counters diffusion of contaminants inwards. A higher outflow velocity is beneficial for the following reason. When the patterning device support MT is moved along the Y-direction in a first sense, it creates a lower pressure region in its wake, which tends to be filled by environmental gas (which it is desirable to keep out of the internal gaseous environment). When the patterning device support MT then scans back in the opposite sense, it is desirable that the output velocity should be higher at least than the scan speed of the patterning device support MT (and desirably higher than the scan speed plus the maximum velocity of inflow of environmental gas into the lower pressure region) in order to reduce, minimize or completely avoid significant inflow of the environment gas into the internal gaseous environment.

The flow-restricting surfaces 8B, 10B are typically arranged to be substantially parallel to each other. The spacing between the flow-restricting surfaces 8B, 10B is small enough to provide the desired level of outflow velocity for a given overpressure in the internal gaseous environment 4.

FIG. 3 depicts an arrangement corresponding to the arrangement of FIG. 2 except that the internal gaseous environment 4 is located below the patterning device MA. The internal gaseous environment 4 depicted is thus a volume through which the radiation beam passes after it has encountered the patterning device MA. The internal gaseous environment 4 is contained by the support MT and patterning device MA on one side and by a first element (and surrounding hardware) 3 of the projection system PS on the other side. The support MT in this example comprises a first planar element 9A formed in a lower portion thereof. The first planar element 9A has a first flow-restricting surface 9B. The first element of the projection system PS has a second planar element 11A attached to an upper surface thereof. The second planar element 11A has a second flow-restricting surface 11B. The second flow-restricting surface 11B is configured to face the first flow-restricting surface 9B. Either or both of the planar elements 9A, 11A may comprise two substantially parallel, planar surfaces that are spaced apart from each other parallel to the Z-axis. Alternatively, either or both of the planar elements 9A, 11A may comprise only a single planar surface (which would be the flow-restricting surface 9B, 11B in this case).

In both the arrangement of FIG. 2 and the arrangement of FIG. 3, arrows 6 show schematically the flow of gas from the outlet 7 of the gas supply system 5 through a central region of the internal gaseous environment 4 and out through the gap between the flow-restricting surfaces 8B, 9B, 10B, 11B to the region outside the internal gaseous environment 4.

The internal gaseous environments 4 of FIGS. 2 and 3 are shown in separate locations. The internal gaseous environments 4 need not be isolated from each other. The internal gaseous environments 4 could be connected together. In this case, a single gas supply system 5 could be provided. The single gas supply system 5 could have a single outlet 7 either above or below the patterning device MA. Gas would be able to flow between the internal gaseous environment 4 above the patterning device MA and the internal gaseous environment 4 below the patterning device MA by connections between the internal gaseous environment 4 above the patterning device MA and the internal gaseous environment 4 below the patterning device MA. In an embodiment, the single gas supply system 5 could have a plurality of outlets 7 below, above, or below and above the patterning device MA.

In the example shown, the gas supply system 5 and outlet 7 are incorporated into the support MT. In an embodiment, the gas supply system 5 and/or outlet 7 may be mounted to other components. For example, the gas supply system 5 and/or outlet 7 could be attached to the final element (or surrounding hardware) 2 of the illumination system IL and/or the first element (or surrounding hardware) 3 of the projection system PS.

As shown by the embedded axes, the arrangements of FIGS. 2 and 3 are shown from the side, relative to a typical orientation of the lithographic apparatus in use. The vertical direction in the plane of the page is parallel to the Z-axis (which is normally parallel to the optical axis of the projection system PS). The horizontal direction in the plane of the page is parallel to the X-axis. The X-axis and Z-axis are both perpendicular to a particular direction of motion of the support MT (also referred to as the Y-direction or a direction parallel to the Y-axis). The Y-axis is thus perpendicular to the plane of the page.

Figure 4:
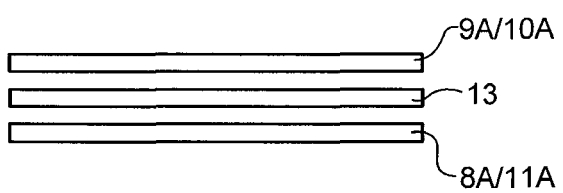
FIG. 4 depicts an arrangement comprising an additional planar element between first and second flow-restricting surfaces.
Figure 5:
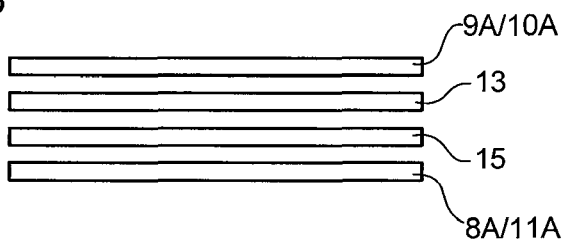
FIG. 5 depicts an arrangement comprising two additional planar elements between the first and second flow-restricting surfaces.

In the examples of FIGS. 2 and 3, the first flow-restricting surface 8B, 9B is configured to face the second flow-restricting surface 10B, 11B directly (i.e. with no other element in between). In an embodiment, one or more additional planar elements may be provided between the first and second flow-restricting surfaces 8B, 9B, 10B, 11B. FIG. 4 shows an example arrangement comprising one additional planar element 13. FIG. 5 shows an example arrangement comprising two additional planar elements 13 and 15. Each of the additional planar elements 13, 15 will have flow-restricting upper and lower surfaces that face the flow-restricting surfaces of directly adjacent planar elements. The provision of additional planar elements provides greater flexibility for channeling flow and/or controlling flow resistance.

The support MT for the patterning device MA is provided with a support driver 25. The support driver 25 may be considered to form part of the positioner PM described above with reference to FIG. 1. The support driver 25 may be configured to drive the support MT linearly along the particular direction.

Figure 6:
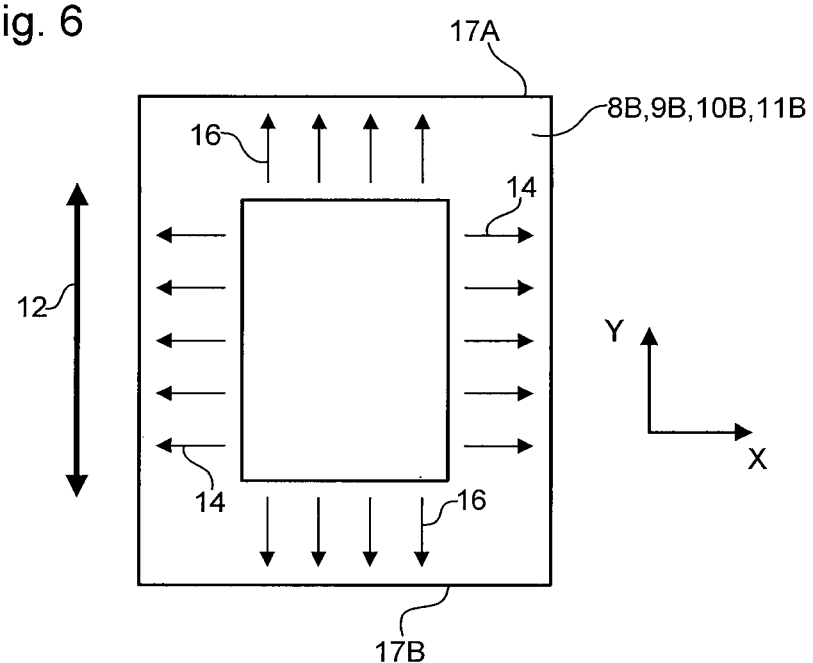
FIG. 6 is a top view of a flow-restricting surface showing outflow of gas from an internal gaseous environment.

FIG. 6 is a schematic top view of a flow-restricting surface 8B, 9B, 10B, 11B showing the relationship between movement of the support MT and the direction of outward flow of gas. Movement of the support MT along the Y-axis will cause a corresponding relative movement (arrows 12) between opposing flow-restricting surfaces. For example, in the arrangement of FIG. 2, movement of the support MT along the Y-axis will cause relative movement between the first and second flow-restricting surfaces 8B, 10B. In the arrangement of FIG. 3, movement of the support MT along the Y-axis will cause relative movement between the first and second flow-restricting surfaces 9B, 11B.

The flow-restricting surfaces 8B, 9B, 10B, 11B are provided to restrict flow out of the internal gaseous environment 4. The flow-restricting surfaces 8B, 9B, 10B, 11B may therefore be configured to form a closed or semi-closed loop through which the radiation beam will pass in use (i.e. the closed or semi-closed loop will at least partially surround the radiation beam in use). A semi-closed loop is a loop which surrounds the radiation beam azimuthally in most directions, but which contains breaks where the flow-restricting surfaces 8B, 9B, 10B, 11B are not present. Looking along the Z-axis, the flow-restricting surfaces 8B, 9B, 10B, 11B may therefore completely or partially surround the patterning device MA. Arrows 14 and 16 illustrate the flow of gas out through the gap between flow-restricting surfaces 8B and 10B or between flow-restricting surfaces 9B and 11B.

The motion of the support MT and of the internal gaseous environment 4 relative to the external gaseous environment increases the risk of contaminants entering the internal gaseous environment 4. At least the following two factors may contribute to this phenomenon. Firstly, the leading edges of the support MT and any flow-restricting surfaces 8B, 9B attached to the support MT (e.g. edge 17A when the support MT is moving in an upwards direction in the page of FIG. 6, or edge 17B when the support MT is moving in a downwards direction in the page of FIG. 6) experience a headwind of gas from the external environment. The gas from the external environment is not controlled to the same level of purity as the gas that is deliberately supplied to the internal gaseous environment 4. It is thus desirable to minimize or avoid entry of gas from the external gaseous environment into the internal gaseous environment 4. From the perspective of the leading edges there is a net flow of gas towards them. The net flow of gas towards the leading edges increases the likelihood of contaminants breaching the seal at the leading edges and entering the internal gaseous environment 4. Secondly, the movement of the support MT creates a region of low pressure in its wake. The pressure difference between this low pressure region and the surrounding region causes a net flow of gas from the external environment (i.e. relatively low purity gas) towards the low pressure region. When the support MT reaches the end of its travel and changes direction, the leading edges will be driven towards the low pressure region and through the gas which is flowing into the low pressure region. The net flow of gas relative to the leading edges will thus be even greater when the support WT changes direction. The risk of contamination of the internal gaseous environment 4 is thus increased further.

According to disclosed embodiments, risk of contamination is reduced by arranging for the flow resistance provided by the flow-restricting surfaces 8B, 9B, 10B, 11B, for a given width of the flow-restricting surfaces perpendicular to the flow, to be greater in respect of flow directed parallel to the X-axis (e.g., substantially perpendicular to the particular linear direction of motion of the support MT; arrows 14 in FIG. 6) than for flow directed parallel to the Y-axis (e.g., substantially parallel to the particular linear direction of motion of the support MT; arrows 16 in FIG. 6). For a given overpressure in the internal gaseous environment 4, this provides a greater outward flow rate at the leading edges of the flow-restricting surfaces 8B, 9B, 10B, 11B. The risk of contamination entering the internal gaseous environment via the leading edges is thereby reduced.

In principle, the flow resistance could be made greater at the side edges (e.g., the edges parallel to the Y-axis) than at the leading edges (e.g., parallel to the X-axis) by making the separation between opposing flow-restricting surfaces smaller at the side edges than at the leading edges. This could be achieved by increasing the separation at the leading edges, or decreasing the separation at the side edges, or both. Increasing the separation at the leading edges may be undesirable because it may have the effect of lowering the overall overpressure. Decreasing the separation at the side edges may introduce undesirably tight manufacturing tolerances.

In an embodiment, one or more of the flow-restricting surfaces may be provided with at least one projection and/or recess in the gap between opposing flow-restricting surfaces. A plurality of such projections and/or recesses may be provided on each of one or more of the flow-restricting surfaces. The projections and/or recesses interfere with the flow of gas through the gap between the flow-restricting surfaces. This may be achieved by increasing the level of turbulence in the flow of gas, for example. Alternatively or additionally, the projections and/or recesses may increase the distance that gas has to travel through the gap. The projections and/or recesses may thus increase the flow resistance.

The terms "projections" and "recesses" are used to describe the surface profile of the flow-restricting surfaces. The term "projection" is generally used to refer to a portion of the flow-restricting surface that projects outwards more than other portions of the flow-restricting surface. The term "recess" is generally used to refer to a portion of the flow-restricting surface that projects inwards more than other portions of the flow-restricting surface.

In example embodiments, the flow-restricting surfaces are formed by cutting grooves or other shaped recesses into a substantially planar (flat) sheet. In this case, it would be natural to describe the resulting surface profile by reference to the shapes of the grooves or other shaped recesses and to the shapes of the regions between the grooves or other shaped recesses. However, the regions between the grooves or other shaped recesses could equally be referred to as projections. Thus, the same surface profile could in principle be described in terms of projections and regions between projections.

On the other hand, a surface profile may be formed by cutting recesses into a sheet on which projections have already been formed, the recesses being cut into regions lying between the projections. In this way a surface profile having three different levels is generated: the lowest level corresponds to the base of the recesses; an intermediate level corresponds to the regions that are between both the recesses and the projections; and a highest level corresponds to the peaks of the projections. In arrangements of this type, it may be natural to describe the surface profile in terms of both projections and recesses. More generally, the surface profile may be formed from projections and/or recesses that define more than three different height levels. The surface profile may be formed from projections and/or recesses that have a continuous range of height levels.

In the particular examples that follow, the example surface profiles all have just two heights. The surface profiles can thus be described easily in terms of projections only, or in terms of recesses only. However, it should be understood that the invention is not limited to such binary profiles.

The use of the terms "recess" and "projection" does not imply any particular method of manufacture. In particular, use of the term "recess" does not imply that material was cut or removed from an otherwise planar sheet. Similarly, use of the term "projection" does not imply that material has been added to a surface.

Furthermore, description of a surface profile in terms of "recesses" only does not imply that the surface area associated with the recesses is less than the surface area associated with the regions between the recesses (which might also be described in terms of projections). Similarly, description of a surface profile in terms of "projections" does not imply that the surface area associated with projections is less than the surface area associated with the regions between the projections (which might also be described in terms of recesses). For example, a planar surface described as comprising a single narrow elongate recess could equally be described as a planar surface having two broad elongate projections with a narrow spacing in between them.

The projections and/or recesses can be used to make the flow resistance greater at the side edges than at the leading edges in an efficient manner. Several approaches are possible. For example, the number or density of projections and/or recesses can be made greater on the side edges than on the leading edges. The density of projections and/or recesses in a given region of a given flow-restricting surface may be defined as the ratio of the surface area of the region taken up by the projections and/or recesses to the total surface area of the region. More generally, the number or density of the projections and/or recesses can be made lower in regions of the first and second flow-restricting surfaces through which the direction of flow of gas in use is on average more closely aligned with the particular direction of motion of the support MT (e.g., along the Y-direction) than with a direction perpendicular to that direction (e.g., along the X-direction) in comparison with regions of the first and second flow-restricting surfaces through which the direction of flow of gas in use is on average more closely aligned with the direction perpendicular to the particular direction of motion of the support MT (e.g., along the X-axis) than with the particular direction of motion of the support MT (e.g., along the Y-axis). Examples of this approach are described below with reference to FIGS. 7A and 7B. Alternatively or additionally, the individual projections and/or recesses may be shaped so as to resist flow parallel to the direction perpendicular to the particular direction of motion of the support MT (e.g., along the X-axis) more than flow parallel to the particular direction of motion of the support MT (e.g., along the Y-axis). Examples of this approach are discussed below with reference to FIGS. 9 to 14.

The height of all or a subset of the projections and/or the depth of all or a subset of the recesses may be greater than 2%, greater than 5%, or greater than 10% of the mean average distance between opposing flow-restricting surfaces of a pair of flow-restricting surfaces 8B, 9B, 10B, 11B.

The projections and/or recesses are configured so that they do not interfere with relative movement between flow-restricting surfaces. The projections and/or recesses are arranged such that relative movement does not result in a projection (region between two recesses) on one flow-restricting surface being brought into contact with a projection (region between two recesses) on a different flow-restricting surface.

Figure 10:
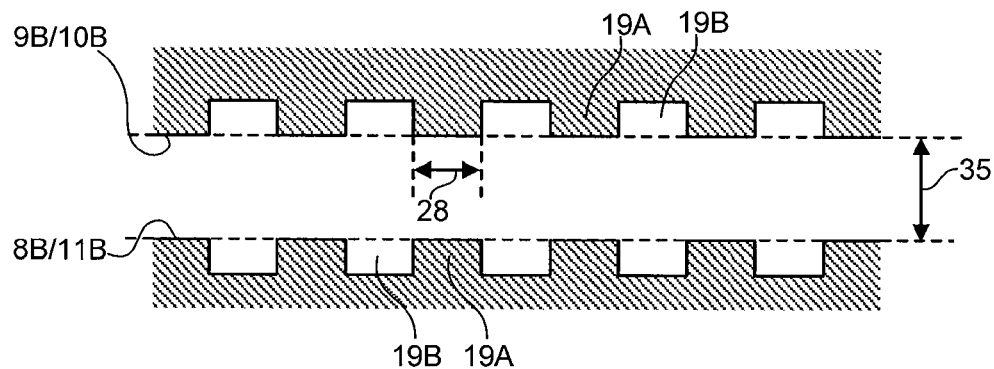
FIG. 10 depicts a further example arrangement in which both opposing flow-restricting surfaces comprise projections/recesses.
Figure 11:
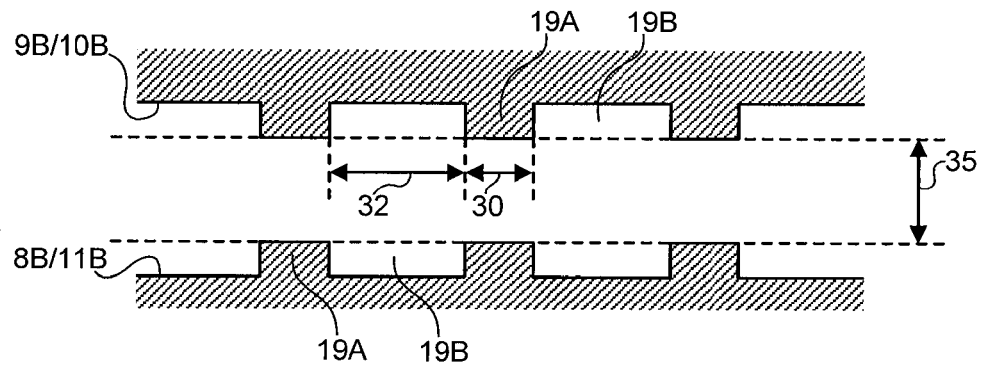
FIG. 11 depicts a further example arrangement in which the separation between projections/recesses is larger than the width of the projections/recesses.

One way in which such interference can be prevented is to arrange for the height of projections (or the depth of the recesses) on different flow-restricting surfaces to be small enough relative to the separation between the flow-restricting surfaces that contact is impossible for the whole range of movement of the support MT, even when the relative positions of flow-restricting surfaces are such that projections on different surfaces (or the regions between recesses) overlap when viewed along the Z-axis. FIGS. 10 and 11 show examples of such configurations.

Figure 14:
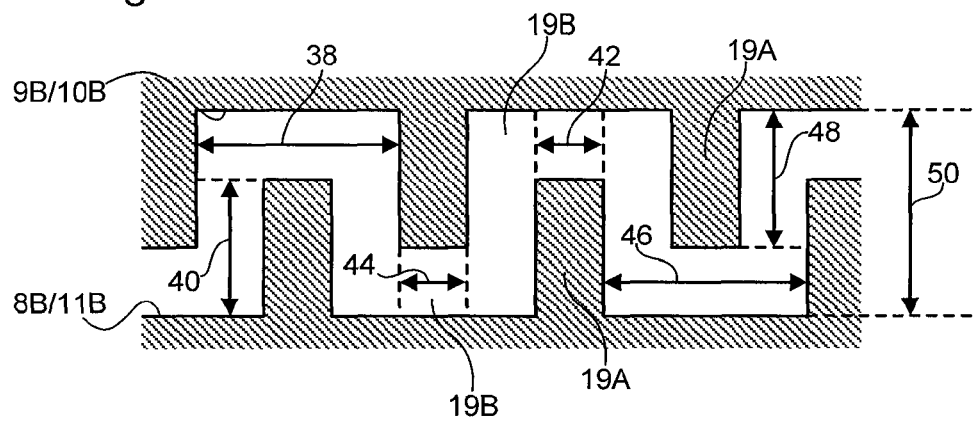
FIG. 14 depicts a further example arrangement in which the projections on one flow-restricting surface overlap, when viewed along the X-direction, with the projections on the opposing flow-restricting surface.

An alternative or additional approach to preventing interference between projections (or regions between recesses) during movement of the support MT is to position the projections and/or recesses such that there is never any overlap, when viewed along the Z-axis, between portions of projections (or portions of regions between adjacent recesses) that are high enough to touch each other if overlap did occur. FIG. 14 shows an example of an arrangement of this type.

Figure 7A:
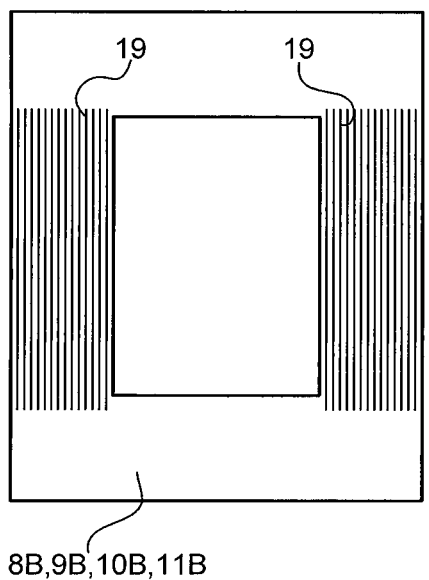
FIG. 7A is a top view of a flow-restricting surface having projections/recesses positioned on side portions; in this example the projections/recesses are elongate and aligned substantially parallel to the Y-axis.
Figure 7B:
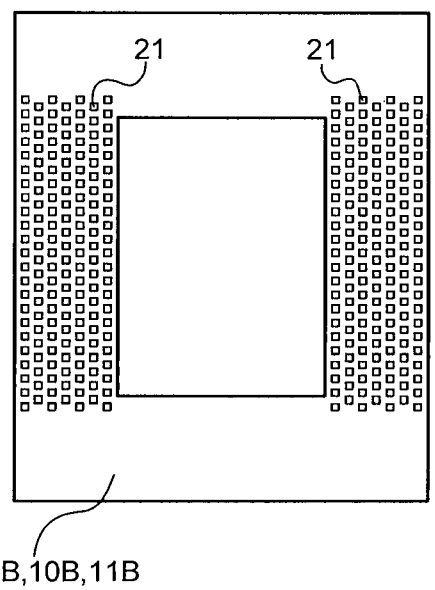
FIG. 7B is a top view of a flow-restricting surface having projections/recesses positioned on the side portions; in this example the projections/recesses are not elongate.

FIGS. 7A and 7B illustrate positioning of projections/recesses only on side edges of a flow-restricting surface 8B, 9B, 10B, 11B. These embodiments thus represent particular cases of the approach of providing a higher number or density of projections/recesses along the side edges than on the leading edges. In the arrangements of FIGS. 7A and 7B, the leading edges do not have any projections or recesses. Optionally, the surfaces of the leading edges are co-planar with the tops of the projections (the regions between adjacent recesses) in the side edges. Optionally, the leading edges are co-planar with the bottoms of the regions between the projections (the recesses) in the side edges.

In FIG. 7A, the projections/recesses 19 are elongate and aligned with the Y-axis. The flow resistance is higher against flow parallel to the X-axis than against flow parallel to the Y-axis for two reasons: 1) the elongate form of the projections/recesses 19 resists flow that is perpendicular to the direction of elongation (i.e. parallel to the X-axis) more than flow that is parallel to the direction of elongation (i.e. parallel to the Y-axis); and 2) the projections/recesses 19 are only located on the side edges, where the flow will be predominantly parallel to the X-axis.

In FIG. 7B, the projections/recesses 21 are not elongate. However, the projections/recesses 21 still increase the resistance to flow. Because the projections/recesses 21 are only located on the side edges, the effect will be to present a greater resistance against flow parallel to the X-axis than against flow parallel to the Y-axis.

Figure 8A:
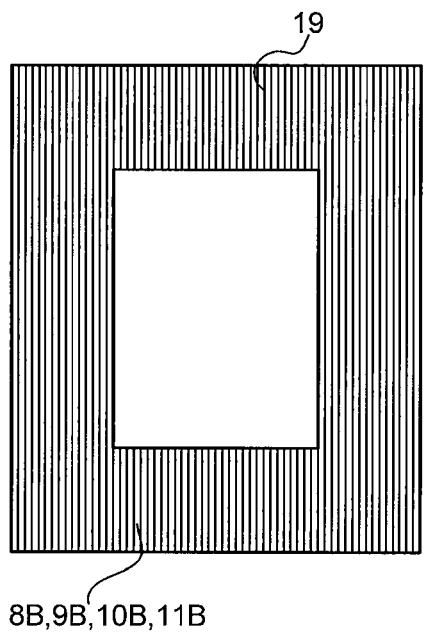
FIG. 8A is a top view of a flow-restricting surface having elongate projections/recesses on both side and leading edge portions; in this example the projections/recesses are aligned substantially parallel to the Y-axis.
Figure 8B:
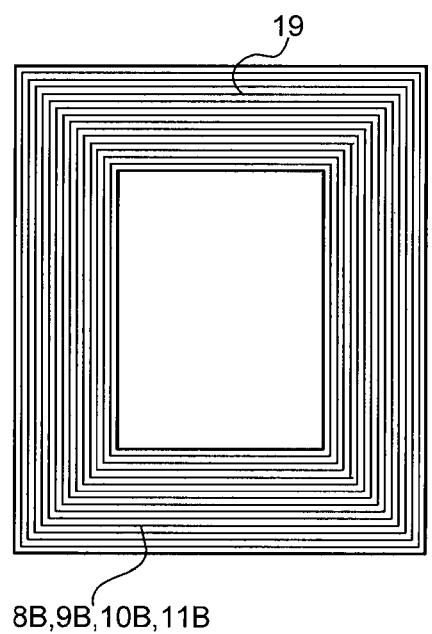
FIG. 8B is a top view of a flow-restricting surface having elongate projections/recesses on both side and leading edge portions; in this example the projections/recesses are aligned substantially parallel to the Y-axis along the side portions and substantially perpendicular to the Y-axis along the leading edge portions.

FIGS. 8A and 8B depict arrangements in which projections/recesses 19 are provided also in the leading edge regions of the flow-restricting surfaces 8B, 9B, 10B, 11B.

In the example of FIG. 8A, the projections/recesses 19 are elongate and aligned parallel to the Y-axis, even in the leading edge regions. The form and orientation of projections/recesses 19 in the leading edge region in the arrangement of FIG. 8A help to channel flow towards the leading edges and help to prevent inflow of contamination. Optionally, for each flow-restricting surface 8B, 9B, 10B, 11B, the regions where projections/recesses 19 are not present (e.g. the regions between neighboring projections/recesses 19, the regions between projections/recesses 19 and the outer or inner edges of the flow-restricting surface 8B, 9B, 10B, 11B, etc.) lie in a common plane. This surface profile may arise where the projections/recesses 19 are formed by cutting grooves into an initially planar surface, for example. In this case, the projections/recesses 19 increase the cross-sectional area that is available for gas flow through the leading edges (relative to the planar surface prior to formation of the projections/recesses). Increasing the cross-sectional area for flow will tend to decrease the flow resistance. At the same time, in the side edges the projections/recesses 19 will tend to increase the flow resistance because the projections/recesses 19 are not oriented parallel to the flow in the side edges. Manufacturing parallel projections/recesses in an initially planar sheet is relatively efficient. Therefore, this approach allows increased flow resistance at the side edges and decreased flow resistance at the leading edges to be achieved via a structure that is easily manufactured.

In the example of FIG. 8B, the projections/recesses 19 are again elongate, but are aligned parallel to the X-direction in the leading edge regions. This arrangement helps to increase the flow resistance in the leading edge regions and facilitates maintenance of a stable overpressure in the internal gaseous environment.

The projections/recesses 19, 21 depicted in FIGS. 7A, 7B, 8A and 8B are not to scale. In most practical situations, the projections and/or recesses will be much smaller and/or more closely spaced than those shown.

Alternatively or additionally, the projections and/or recesses 19, 21 may be provided at an oblique angle. More generally, in example embodiments, the elongate projections and/or recesses 19, 21 are oriented and formed so as to provide a larger resistance against gas flow parallel to the X-axis than against gas flow parallel to the Y-axis.

FIGS. 9 to 14 depict example configurations for projections/recesses. Reference is made to elongate projections/recesses 19 but an embodiment, may apply to projections/recesses 21. In each of FIGS. 9 to 14, a cross-sectional profile is depicted. The surface profiles in these examples are all binary (with two heights only) and, as explained above, can thus be described in terms of projections only or recesses only. For clarity, however, reference is made both to the projections 19A and to the recesses 19B. The cross-sectional profile is perpendicular to the direction along which the projections 19A and recesses 19B are aligned. Generally, it will be desirable to arrange for the projections 19A and recesses 19B to be aligned substantially parallel with the Y-axis. For each of the arrangements shown in FIGS. 9 to 14, the pair of flow-restricting surfaces 9B, 10B and 8B, 11B are parallel to each other. In an embodiment, the pair of flow-restricting surfaces 9B, 10B and 8B, 11B may be arranged to be non-parallel. For example, the pair of flow-restricting surfaces 9B, 10B and 8B, 11B may be arranged to be inclined relative to each other. The surface profile defined by the projections 19A and recesses 19B shown in FIGS. 9 to 14 are formed from rectilinear elements. However, other shapes could be used. For example, either or both of the projections 19A and recesses 19B may comprise oblique angles and/or curved elements.

Figure 9:
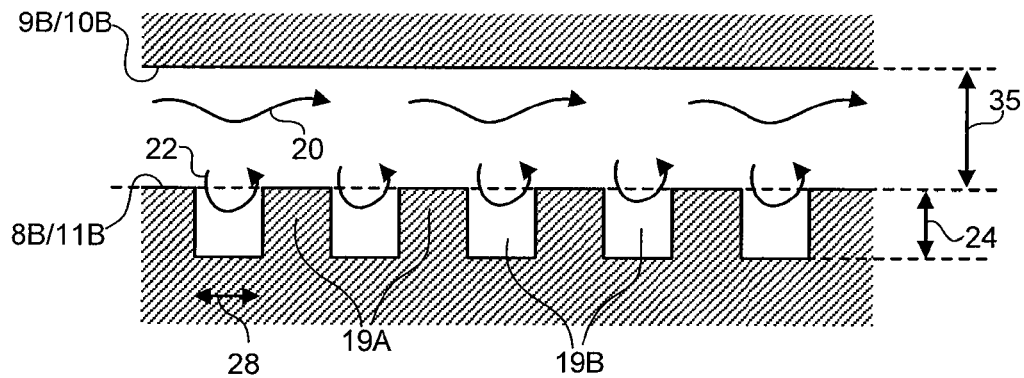
FIG. 9 depicts an example arrangement of projections/recesses in which only one of the opposing flow-restricting surfaces comprises projections/recesses.

FIG. 9 depicts a pair of flow-restricting surfaces 9B, 10B and 8B, 11B. In this example, projections 19A and recesses 19B are formed only on one of the flow-restricting surfaces 8B, 11B (the lower flow-restricting surface in this example, but the projections 19A and recesses 19B could equally be formed in the upper flow-restricting surface) of the pair of flow-restricting surfaces 9B, 10B and 8B, 11B. The projections 19A and recesses 19B in this example are regularly spaced. In an embodiment, the spacing varies. In addition, the width 28 of each projection 19A is equal to the spacing between each projection 19A (the width of each recess 19B). In an embodiment, the spacing between the projections 19A is different from the width of each projection 19A. The height 24 of the projections 19A (depth of the recesses 19B) is constant in this example, but the height may vary. The width 28 of each projection 19A is constant in this example, but the width 28 may vary.

Arrows 20 and 22 illustrate schematically how the flow through the gap between the flow-restricting surfaces 8B, 9B, 10B, 11B, perpendicular to the projections 19A and recesses 19B, is affected by the projections 19A and recesses 19B. The flow perpendicular to the projections 19A and recesses 19B will be parallel to the X-axis when the projections 19A and recesses 19B are aligned parallel to the Y-axis. As can be seen, the presence of the projections 19A and recesses 19B tends to cause turbulence which disrupts the otherwise laminar flow of gas. The flow resistance with respect to flow parallel to the X-axis is therefore increased. The rate of flow of gas is thus reduced. An anti-clockwise vortex flow is shown, but this is purely schematic to illustrate visually the general disruption to the flow. According to the particular conditions present, the dominant vortex flow may be different, for example clockwise, or clockwise and anti-clockwise (in different locations).

Figure 13:
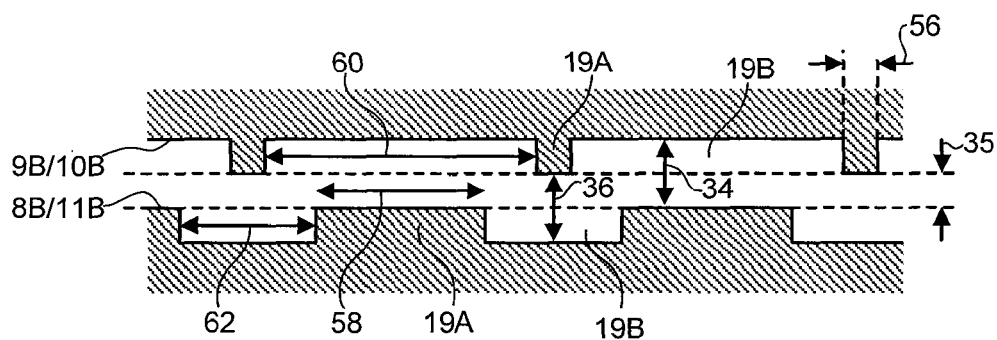
FIG. 13 depicts a further example arrangement in which the projections/recesses on one flow-restricting surface are offset relative to the projections/recesses on the opposing flow-restricting surface, are of a different form, and in which there is no overlap between the two flow-restricting surfaces when viewed along the X-direction.

FIG. 10 depicts a further configuration for the projections 19A and recesses 19B. In this example, projections 19A and recesses 19B are provided on both of the flow-restricting surfaces of the pair of flow-restricting surfaces 9B, 10B and 8B, 11B. The form of the projections 19A and recesses 19B is similar to the projections and recesses shown in FIG. 9. In an embodiment, the form of the projections 19A and recesses 19B on either or both of the pair of flow-restricting surfaces 9B, 10B and 8B, 11B could be varied in one or more of the ways described above with reference to FIG. 9. In this example, the form of the projections 19A and recesses 19B on both of the flow-restricting surfaces of the pair of flow-restricting surfaces 9B, 10B and 8B, 11B is the same. In addition, the projections 19A and recesses 19B are aligned with each other in the direction perpendicular to the plane of the flow-restricting surfaces 8B, 9B, 10B, 11B. In an embodiment, the form of the projections 19A and/or recesses 19B is/are different and/or misaligned on one of the flow-restricting surfaces of the pair in comparison with the other flow-restricting surface. FIG. 13 illustrates an example of such an embodiment.

FIG. 11 depicts a further configuration for the projections 19A and recesses 19B. In this example, the projections 19A and recesses 19B are configured such that the width 30 of the projections 19A is substantially smaller than the separation 32 between the projections 19A (i.e. the width of the recesses 19B). As in the example of FIG. 10, the form of the projections 19A on both of the flow-restricting surfaces of the pair of flow-restricting surfaces 8B, 9B, 10B, 11B is the same. In addition, the projections 19A and recesses 19B are aligned with each other in the direction perpendicular to the plane of the flow-restricting surfaces 8B, 9B, 10B, 11B. In an embodiment, the form of the projections 19A and/or recesses 19B is/are different and/or misaligned on one of the flow-restricting surfaces of the pair in comparison with the other flow-restricting surface (see FIG. 13 for an example). In an embodiment, the width of the projections 19A and/or recesses 19B is arranged to be substantially greater than the separation between the projections 19A (i.e. the width of the recesses 19B).

Figure 12:
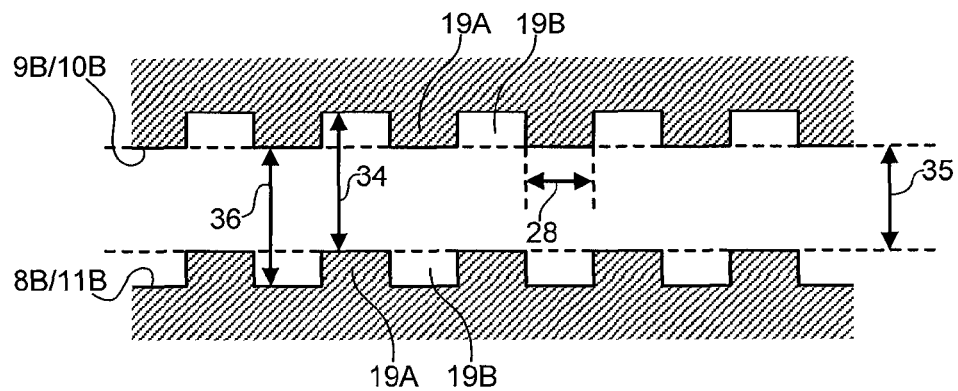
FIG. 12 depicts a further example arrangement in which the projections/recesses on one flow-restricting surface are offset relative to the projections/recesses on the opposing flow-restricting surface.

FIG. 12 depicts a further configuration that is the same as the configuration shown in FIG. 10, except that the projections 19A and recesses 19B on one of the flow-restricting surfaces of the pair 9B, 10B and 8B, 11B are in a staggered relationship with respect to the projections 19A and recesses 19B on the other flow-restricting surface of the pair. The projections 19A on one surface 9B, 10B are thus opposite to the recesses 19B on the opposite surface 8B, 11B. In an embodiment, the distance 34 and distance 36 are equal.

FIG. 13 depicts a further configuration that is the same as the configuration shown in FIG. 12, except that the width 56 of each of the projections 19A on one of the flow-restricting surfaces is smaller than the width 58 of each of the projections 19A on the other flow-restricting surface. In an embodiment, the width 60 of each of the recesses 19B on one of the flow-restricting surfaces is larger than the width 62 of each of the recesses 19B on the other flow-restricting surface. In an embodiment, the widths of the projections 19A and recesses 19B on one of the flow-restricting surfaces are different while the widths of the projections 19A and recesses 19B on the other flow-restricting surface are the same. In an alternative embodiment, the widths of the projections 19A and recesses 19B on one of the flow-restricting surfaces are different while the widths of the projections 19A and recesses 19B on the other flow-restricting surface are also different. In an embodiment, the distance 34 and distance 36, representing the distances between the tips of projections 19A and bottoms of recesses 19B on different flow-restricting surfaces, are equal. In other embodiments, the distances 34 and 36 are unequal. In an embodiment, the distance 35 is greater than zero, indicating that there is no overlap between projections 19A on different flow-restricting surfaces, when viewed along the X-direction. In an embodiment, each of the projections 19A on one of the flow-restricting surfaces are aligned with the center of one of the recesses 19B on the other flow-restricting surface. In an embodiment, each of one or more of the projections 19A on one of the flow-restricting surfaces is not aligned with the center of any of the recesses 19B on the other flow-restricting surface. In an embodiment of this type the one or more projections 19A are partially or completely encompassed within a region facing one of the recesses 19B on the other flow-restricting surface. In an embodiment, the width of each of the projections 19A on one of the flow-restricting surfaces is smaller than the width of a recess 19B on the other flow-restricting surface opposite to that projection 19A.

In an embodiment of the type shown in FIG. 13, the dimensions of the projections 19A and recesses 19B are chosen so as to provide significant clearance horizontally (in the orientation as depicted) and/or vertically (in the orientation as depicted). In an embodiment, the projections 19A on different flow-restricting surfaces overlap in the direction perpendicular to the plane (in the vertical direction in the orientation depicted). The distance 35 may be considered to be negative in such an embodiment. In an embodiment of this type, the distance 34 and/or 36 between opposing surfaces is equal to or greater than the distance of overlap between the projections 19A on different flow-restricting surfaces (the magnitude of the negative distance 35). In an embodiment, the separation 60 between adjacent ones of the plurality of projections 19A on one of the flow-restricting surfaces minus the separation 58 between adjacent ones of the plurality of recesses 19B on the other flow-restricting surface equals at least twice the distance 34 and/or 36 (between the tip of each of the projections 19A and the bottom of the recess 19B that is opposite).

FIG. 14 shows an example where the heights of the projections 19A (i.e. the regions between adjacent recesses 19B) are large enough that one or more of the projections 19A on one surface 9B, 10B of the pair overlap, when viewed along the X-direction, with one or more of the projections 19A on the other surface 8B, 11B. In the arrangement of FIG. 14, the overlap occurs because the sum of the height 48 of the projections 19A on the upper surface 9B, 10B and the height 40 of the projections 19A on the lower surface 8B, 11B is greater than the largest distance 50 between the flow-restricting surfaces 8B, 9B, 10B, 11B. The separations 38, 46 between the projections 19A (the widths of the recesses 19B) are larger than the widths 42, 44 of the projections 19A to allow the projections 19A on one flow-restricting surface 8B, 9B, 10B, 11B to fit into the recesses 19B on the opposite flow-restricting surface 8B, 9B, 10B, 11B.

Optionally, the width of the space between adjacent projections 19A (i.e. the width of the recesses 19B) is greater than the height of the projections 19A (i.e., the depth of the recesses 19B). This configuration tends to provide an increased flow resistance relative to otherwise equivalent configurations in which the space between projections 19A (width of recesses 19B) is smaller than the height of the projections 19A (depth of the recesses 19B). The increased flow resistance may arise due to a greater degree of turbulence being induced, for example.

Additionally or alternatively, the separation 35 between the flow-restricting surfaces is less than the width of the space between projections 19A (width of recesses 19B). Here, the separation 35 between the flow-restricting surfaces refers to the separation between the plane containing the points of closest approach in each of the flow-restricting surfaces. Typically, these planes will contain the highest points of the projections or the regions between the recesses. This configuration tends to provide an increased flow resistance relative to otherwise equivalent configurations in which the separation between the flow-restricting surfaces is greater than the width of the space between projections 19A (width of the recesses 19B). The increased flow resistance may arise due to a greater degree of turbulence being induced, for example. The separation 35 according to this definition is illustrated in each of the examples shown in FIGS. 9 to 12.

Additionally or alternatively, the separation 35 between the flow-restricting surfaces is less than the height of the projections 19A (depth of recesses 19B). This configuration tends to provide an increased flow resistance relative to otherwise equivalent configurations in which the separation 35 between the flow-restricting surfaces is greater than the height of the projections 19A (depth of recesses 19B). The increased flow resistance may arise due to a greater degree of turbulence being induced, for example.

The separation 35 between the flow restricting surfaces (as defined above) can vary according to particular design requirements. However, it is typically expected that the separation will be in the range of 1 mm to 3 mm, for example 1.3 mm to 1.8 mm. The embodiments described above increase the flow rate parallel to the Y-axis by decreasing the flow rate parallel to the X-axis. The potential benefits of increasing the flow rate parallel to the Y-axis have been discussed above, and an additional benefit will be described later on in this text. Decreasing the flow rate parallel to the X-axis may also be beneficial, for the following reasons.

The position of the support MT for the patterning device MA should be monitored accurately. Typically this is achieved by using a detector to measure a property (for example an interference pattern) of radiation reflected from a target on the support MT. Because the support MT is configured to move predominantly along the Y-axis, it is often beneficial to arrange for the detector to interact with a portion of the support MT on one or more sides aligned predominantly along the Y-axis. In this way it is possible for the detector to be close to the relevant part of the support MT throughout the range of motion of the support MT. If the detector were instead configured to interact with one or more of the leading/trailing edges of the support MT (e.g., one of the sides parallel to the X-axis), the distance between the relevant part of the support MT and the detector would change as the support MT is driven backwards and forwards along the Y-axis. On average the distance between the detector and the leading/trailing edge would be greater because of this movement in comparison to the case where the detector interacts with a side edge.

The accuracy of the detector can be affected by variations in one or more properties of the gas present between the detector and the relevant part of the support MT. The accuracy can be affected by variation in refractive index, for example, which can be caused by variation in humidity, for example.

The level of humidity of the gas within the controlled internal gaseous environment is generally much lower than the humidity of gas in the external environment. Mixing between the gas leaving through the flow-restricting surfaces and gas from the external environment can lead to variation in humidity in the region of the flow-restricting surfaces. The accuracy of the detector can be reduced by such variation in humidity, if it occurs in the region of the detector.

Embodiments disclosed herein can reduce, for example, variation in humidity in the region of the detector by reducing the flow rate through the sections of flow-restricting surfaces that are adjacent to the detector (i.e. on the side of the support MT parallel to the Y-axis). The flow in these regions is substantially parallel to the X-axis and the flow-restricting surfaces according to embodiments of the invention are specifically designed to make flow in this direction more difficult in comparison with flow parallel to the Y-axis.

A further problem that may arise in a system that uses flow-restricting surfaces is overheating of the support driver 25. Certain components of the support driver 25, for example a coil associated with a magnet system of the support driver, generate heat in use. Positioning a large planar element above such a heat-generating component may restrict effective heat transfer/removal. If heat transfer/removal is less efficient the support driver 25 will tend to reach an undesirably high temperature.

According to disclosed embodiments, the problem of overheating of the support driver 25 may be addressed in the following two ways, which can be applied separately or in combination with each other.

Firstly, the flow-restricting surfaces can be arranged, as described in detail above, to favor flow parallel to the Y-axis at the expense of flow parallel to the X-axis. For a given overpressure within the internal gaseous environment, the flow-restricting surfaces will therefore make available a flow of higher velocity (the flow parallel to the Y-axis) than would be available if the flow resistance was uniform in respect of the X- and Y-axes. The higher velocity flow may be used to help carry heat away from a heat-generating component of the support driver 25.

Secondly, the flow-restricting surfaces may be configured to redirect a portion of the higher velocity flow onto a heat-generating component of the support driver 25.

Figure 15:
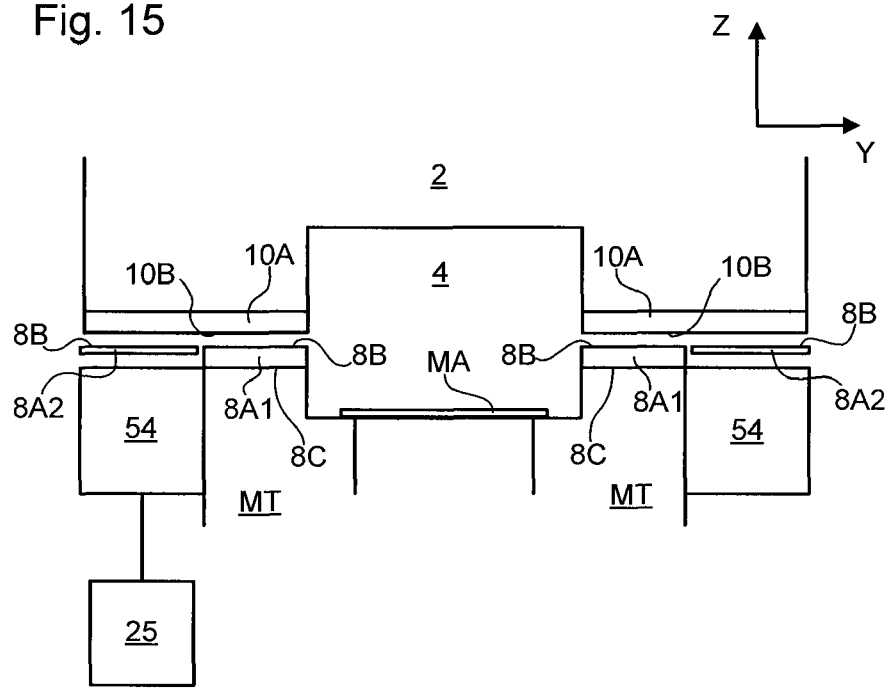
FIG. 15 depicts an arrangement in which an outflow of gas from the internal gaseous environment is directed to cool at least a part of the support driver.

FIG. 15 depicts an example embodiment in which the higher velocity flow is directed onto the surface of a magnet system 54 of the support driver 25. While a magnet system 54 is discussed, an embodiment may, additionally or alternatively, apply to a coil system. The configuration is similar to that of FIG. 2 except that the view is along the X-axis rather than along the Y-axis. Thus, the outward flow between the first and second flow-restricting surfaces 8B and 10B in the plane of the page of FIG. 15 is substantially parallel to the Y-axis rather than the X-axis.

In this example, the planar element of the support MT comprises an inner planar element 8A1 and an outer planar element 8A2. In this example, the inner and outer planar elements 8A1, 8A2 both comprise a flow-restricting surface 8B that is configured to cooperate with an opposing flow-restricting surface 10B to channel and/or provide a flow-resistance against gas flow from the internal gaseous environment 4. In this example, the outer planar element 8A2 is positioned above the magnet system 54, which tends to generate heat in use. This positioning may be to help thermally isolate a heat sensitive component of the lithography apparatus from the magnet system 54, for example. Alternatively or additionally, this positioning may be to provide a greater area of flow-restricting surface 8B for the purposes of channeling flow or providing a desired flow resistance.

In this example, the flow-restricting surfaces 8B, 10B present a lower flow resistance against flow parallel to the Y-axis than against flow parallel to the X-axis. The flow rate through the portions of the flow-restricting surfaces 8B, 10B illustrated in FIG. 15 will therefore be substantially greater than the flow rate through the portions of the flow-restricting surfaces 8B, 10B depicted in FIG. 2, for a given overpressure in the internal gaseous environment 4. This increased flow rate is in close proximity to the magnet system 54. The increased flow rate will thus tend to increase the extent to which gas circulates in the region around the magnet system (directly, by establishing pressure gradients, or both). Increased circulation will tend to encourage gas that has been heated by the magnet system to move away from the magnet system. The increased flow rate will therefore help to improve cooling of the magnet system 54.

Additionally, the embodiment shown in FIG. 15 is such that the flow-restricting surface 8B of the inner planar element 8A1 comprises elongate recesses (grooves) projecting downwards to a base level 8C within the inner planar element 8A1 that is lower than a lower surface of the outer planar element 8A2. In this way, the recesses in the inner planar element 8A1 effectively provide a conduit leading to the space in between the magnet system 54 and the outer planar element 8A2. This conduit allows gas from the internal gaseous environment 4 to flow directly over the magnet system 54 despite the presence of the additional plate (the outer planar element 8A2) above the magnet system 54. The flow of gas directly over the magnet system 54 improves the cooling of the magnet system 54.

The flow-restricting surface 8B of the outer planar element 8A2 may comprise projections or recesses of the type discussed above to control and/or channel a flow of gas out of the internal gaseous environment 4. Alternatively, the flow-restricting surface 8B of the outer planar element 8A2 may comprise no projections or recesses.

In the example shown, substantially all of the flow-restricting surface 8B of the outer planar element 8A2 cooperates with a flow-restricting surface 10B located above the flow-restricting surface 8B of the outer planar element 8A2. In an embodiment, the outer planar element 8A2 may be configured so that only a portion of its upper, flow-restricting surface 8B cooperates with an opposing flow-restricting surface (for example, the outer planar element 8A2 may be configured partially to protrude laterally beyond the flow-restricting surface 10B) or so that no part of its upper, flow-restricting surface 8B cooperates with an opposing flow-restricting surface (for example, the outer planar element 8A2 may be configured completely to protrude laterally beyond the flow-restricting surface 10B).

In this example, the flow-restricting surfaces 8B, 10B are arranged such that the flow rate is greater through the leading edge portions (the portions substantially perpendicular to the Y-axis) than through the edge portions (the portions substantially parallel to the Y-axis) and the flow-restricting surfaces 8B, 10B comprise grooves that channel the outflow of gas into the region beneath the outer planar element 8A2. However, these features can be made to operate independently and could be provided separately. Arranging for the flow to be greater at the leading edge portions can provide improved cooling of the magnet system 54 even if grooves directing the flow directly onto the magnet system 54 (optionally beneath an outer planar element 8A2) are not present. Similarly, providing grooves that channel the flow directly onto the magnet system 54 (optionally beneath an outer planar element 8A2) can improve cooling of the magnet system 54 even if the flow rate in the leading edge regions is not enhanced relative to the flow rate at the side regions.

In the example shown, the base level 8C (depth) of the grooves in the flow-restricting surface 8B of the inner planar element 8A1 is substantially flat (i.e. parallel to the upper surface of the flow-restricting surface 8B). In an embodiment, the base level 8C is provided with a slope, desirably leading away from the internal gaseous environment 4 (such that the depths of the recesses increase with distance from the internal gaseous environment 4). Such a slope will help to re-direct flow downwards towards the space in between the outer planar element 8A2 and the magnet system 54. Optionally the slope is inclined at an angle that is less than 7 degrees away from the horizontal (or from the plane of the top surface of the flow-restricting surface 8B). This range of angles helps to avoid undesirable separation between the flow and the bottom surface of the recesses.

In an embodiment, there is provided a lithographic apparatus comprising: a support constructed to support a patterning device, the patterning device being capable of imparting a radiation beam with a pattern in its cross-section to form a patterned radiation beam, the support comprising a first planar element having a first flow-restricting surface; a projection system configured to project the patterned radiation beam onto a target portion of a substrate; a second planar element comprising a second flow-restricting surface facing the first flow-restricting surface; and a support driver to drive movement of the support relative to the second planar element, wherein the first flow-restricting surface, the second flow-restricting surface, or both the first and second flow-restricting surfaces, comprises a projection and/or recess between the first and second flow-restricting surfaces, wherein the support driver is configured to drive the support linearly along a certain direction relative to the second planar element, and wherein the projection and/or recess on the first and/or second flow-restricting surface is arranged to provide a flow resistance, per unit width of the first and/or second flow-restricting surface perpendicular to the flow, that is lower against flow that is parallel to the certain direction than against flow that is perpendicular to the certain direction.

In an embodiment, the first and second flow-restricting surfaces and all of the projection(s) and/or recess(es) on either or both of the first and second flow-restricting surfaces are arranged such that the first flow-restricting surface can move relative to the second flow-restricting surface, along the certain direction, without any part of the first flow-restricting surface coming into contact with any part of the second flow-restricting surface. In an embodiment, the first and second flow-restricting surfaces each form a closed or semi-closed loop through which the radiation beam will pass in use. In an embodiment, the projection and/or recess on the first and/or second flow-restricting surface is arranged to provide a flow resistance, per unit width of the first and/or second flow-restricting surface perpendicular to the flow, against flow directed in or out of the closed or semi-closed loop, that is higher on a portion of the closed or semi-closed loop that is substantially parallel to the certain direction than on a portion of the closed or semi-closed loop that is substantially perpendicular to the certain direction. In an embodiment, the first and/or second flow-restricting surface comprises a higher density of projections and/or recesses on a portion of the closed or semi-closed loop that is substantially parallel to the certain direction than on a portion of the closed or semi-closed loop that is substantially perpendicular to the certain direction. In an embodiment, the first and/or second flow-restricting surface comprises substantially no projection and/ or recess on a side of the closed or semi-closed loop that is substantially perpendicular to the certain direction. In an embodiment, the first and/or second flow-restricting surface comprises elongate recesses, and, for each of the flow-restricting surfaces, the regions where elongate recesses are not present are substantially in the same plane; and the elongate recesses are formed in both a side of the closed or semi-closed loop that is substantially parallel to the certain direction and in a side of the closed or semi-closed loop that is substantially perpendicular to the certain direction. In an embodiment, the lithographic apparatus further comprises a gas supply system to supply gas to an internal gaseous environment in the region of the patterning device, and wherein: the lithographic apparatus is configured such that a flow of gas out of the internal gaseous environment passes through the gap between the first and second flow-restricting surfaces, and the first and/or second flow-restricting surfaces are configured such that the density of projections and/or recesses is lower in a region of the first and second flow-restricting surfaces through which the direction of flow of gas in use is on average more closely aligned with the certain direction than with a direction perpendicular to the certain direction in comparison with a region of the first and second flow-restricting surfaces through which the direction of flow of gas in use is on average more closely aligned with a direction perpendicular to the certain direction than with the certain direction. In an embodiment, at least one projection and/or recess has a form that presents a larger resistance against gas flow perpendicular to the certain direction than against gas flow parallel to the certain direction. In an embodiment, at least one projection and/or recess has an elongate form that is aligned with the certain direction. In an embodiment, the height of at least one projection and/or a depth of at least one recess is greater than 2% of the mean average distance between the first and second flow-restricting surfaces. In an embodiment, the first and second flow-restricting surfaces are substantially parallel to each other. In an embodiment, the first and second flow-restricting surfaces comprise at least one projection and/or recess. In an embodiment, the heights of the projections on the first and second flow-restricting surfaces, or the depths of the recesses on the first and second flow-restricting surfaces, are such that, for the full range of possible movement of the support, whenever a projection, or a region between two adjacent recesses, on the first flow-restricting surface overlaps, when viewed along an axis perpendicular to the first planar element, with a projection, or a region between two adjacent recesses, on the second flow-restricting surface, the overlapping projections, or overlapping regions, do not touch each other. In an embodiment, projections and/or regions between adjacent recesses on the first flow-restricting surface and projections and/or regions between adjacent recesses on the second flow-restricting surface are positioned such that there is substantially no overlap, when viewed along a direction perpendicular to the plane of the first planar element, between any portion of a projection, or any portion of a region between two adjacent recesses, on the first flow-restricting surface and any portion of a projection, or any portion of a region between two adjacent recesses, on the second flow-restricting surface having heights that would cause the portions to touch each other if they did overlap, for the full range of possible movement of the support. In an embodiment, when viewed from a direction perpendicular to the certain direction and parallel to the plane of the first planar element, at least one projection, or region between adjacent recesses, on the first flow-restricting surface overlaps with at least one projection, or region between adjacent recesses, on the second flow-restricting surface. In an embodiment, the first and/or second flow-restricting surfaces comprise a plurality of projections and/or recesses. In an embodiment, at least one projection and/or recess is elongate, and the width of at least one region between adjacent elongate projections is larger than a height of adjacent elongate projections, or the width of at least one elongate recess is greater than the depth of the elongate recess. In an embodiment, at least one projection and/or recess is elongate, the separation between the first and second flow-restricting surfaces is defined as the separation between the planes containing the points of closest approach in each of the first and second flow-restricting surfaces, and the width and/or height of at least one region between adjacent projections is larger than the separation between the first and second flow-restricting surfaces at at least a portion of the region, or the width and/or depth of at least one recess is greater than the separation between the first and second flow-restricting surfaces at at least a portion of the recess. In an embodiment, the first and/or second flow-restricting surface comprises a plurality of projections and/or recesses that are regularly spaced apart from each other. In an embodiment, the first and/or second flow-restricting surface comprises a plurality of elongate projections in which the width of each of the elongate projections is smaller than the separation between directly adjacent elongate projections or in which the width of each of the elongate projections is greater than the separation between directly adjacent elongate projections. In an embodiment, one of the first and second flow-restricting surfaces comprises a plurality of elongate projections that are each opposite to one of a plurality of recesses on the other of the first and second flow-restricting surfaces. In an embodiment, each of the plurality of elongate projections is aligned with the center of the one of the plurality of recesses that is opposite to that elongate projection. In an embodiment, each of the plurality of elongate projections has a width that is smaller than the width of the one of the plurality of recesses that is opposite to that elongate projection. In an embodiment, the width of each of the plurality of elongate projections is smaller than the separation between adjacent ones of the plurality of elongate projections. In an embodiment, the separation between adjacent ones of the plurality of projections on the one flow-restricting surface minus the separation between adjacent ones of the plurality of recesses on the other flow-restricting surface equals at least twice the distance between the tip of each of the plurality of projections and the bottom of the recess opposite that projection. In an embodiment, the first and second flow-restricting surfaces are configured to limit inflow of gas into an internal gaseous environment through which the radiation beam passes in use after it has encountered the patterning device. In an embodiment, the first and second flow-restricting surfaces are configured to limit inflow of gas into an internal gaseous environment through which the radiation beam passes in use before it has encountered the patterning device. In an embodiment, the lithographic apparatus further comprises a further planar element comprising a further two flow-restricting surfaces, the further planar element being positioned between the first and second flow-restricting surfaces. In an embodiment, the lithographic apparatus further comprises a gas supply system to supply gas to an internal gaseous environment in the region of the patterning device, wherein the lithographic apparatus is configured such that a flow of gas out of the internal gaseous environment passes through the gap between the first and second flow-restricting surfaces. In an embodiment, the first and second flow-restricting surfaces are arranged to direct at least a portion of the flow of gas onto a component of the support driver that generates heat during use. In an embodiment, the first planar element comprises an inner planar element and an outer planar element, and the flow-restricting surface of the inner planar element comprises at least one projection and/or recess forming a conduit for the flow of gas from the internal gaseous environment to a region between the outer planar element and the component of the support driver that generates heat in use.

In an embodiment, there is provided a lithographic apparatus comprising: a support constructed to support a patterning device, the patterning device being capable of imparting a radiation beam with a pattern in its cross-section to form a patterned radiation beam, the support comprising a first planar element having a first flow-restricting surface; a projection system configured to project the patterned radiation beam onto a target portion of a substrate; a second planar element comprising a second flow-restricting surface facing the first flow-restricting surface; a support driver to drive movement of the support relative to the second planar element; and a gas supply system configured to supply gas to an internal gaseous environment in the region of the patterning device, wherein the lithographic apparatus is configured such that a flow of gas out of the internal gaseous environment passes through a gap between the first and second flow-restricting surfaces, and the first and second flow-restricting surfaces are arranged to direct at least a portion of the flow of gas onto a component of the support driver that generates heat during use.

In an embodiment, there is provided a device manufacturing method comprising: supporting a patterning device using a support, the patterning device being capable of imparting a radiation beam with a pattern in its cross-section to form a patterned radiation beam, the support comprising a first planar element having a first flow-restricting surface; moving the support and the first planar element relative to a second planar element, the second planar element comprising a second flow-restricting surface facing the first flow-restricting surface; and projecting the patterned radiation beam onto a target portion of a substrate, wherein the first flow-restricting surface, the second flow-restricting surface, or both the first and second flow-restricting surfaces, comprises a projection and/or recess in a gap between the first and second flow-restricting surfaces, wherein the support is moved linearly along a certain direction relative to the second planar element, and wherein the projection and/or recess on the first and/or second flow-restricting surface is arranged to provide a flow resistance, per unit width of the first and/or second flow-restricting surface perpendicular to the flow, that is lower against flow that is parallel to the certain direction than against flow that is perpendicular to the certain direction.

In an embodiment, there is provided a device manufacturing method comprising: supporting a patterning device using a support, the patterning device being capable of imparting a radiation beam with a pattern in its cross-section to form a patterned radiation beam, the support comprising a first planar element having a first flow-restricting surface; moving the support and the first planar element relative to a second planar element, the second planar element comprising a second flow-restricting surface facing the first flow-restricting surface; supplying gas to an internal gaseous environment in the region of the patterning device; using the first and second flow-restricting surfaces to direct a flow of gas out of the internal gaseous environment onto a component of a support driver that moves the support and that is generating heat; and projecting the patterned radiation beam onto a target portion of a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 436, 405, 365, 355, 248, 193, 157 or 126 nm) and extreme ultraviolet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, catadioptric, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a support constructed to support a patterning device, the patterning device being capable of imparting a radiation beam with a pattern in its cross-section to form a patterned radiation beam, the support comprising a first planar element having a first generally horizontal flow-restricting surface;
   a projection system configured to project the patterned radiation beam onto a target portion of a substrate;
   a second planar element comprising a second generally horizontal flow-restricting surface facing the first flow-restricting surface; and a support driver to drive movement of the support relative to the second planar element, wherein the first flow-restricting surface, the second flow-restricting surface, or both the first and second flow-restricting surfaces, comprises a projection and/or recess between the first and second flow-restricting surfaces, wherein the support driver is configured to drive the support linearly along a certain generally horizontal direction relative to the second planar element, and wherein the projection and/or recess on the first and/or second flow-restricting surface is arranged to provide a flow resistance, per unit width of the first and/or second flow-restricting surface perpendicular to a direction of flow, that is lower against flow that is parallel to the certain direction than against flow in a generally horizontal direction that is perpendicular to the certain direction.

2. The lithographic apparatus according to claim 1, wherein the first and second flow-restricting surfaces and all of the projection(s) and/or recess(es) on either or both of the first and second flow-restricting surfaces are arranged such that the first flow-restricting surface can move relative to the second flow-restricting surface, along the certain direction, without any part of the first flow-restricting surface coming into contact with any part of the second flow-restricting surface.

3. The lithographic apparatus according to claim 1, wherein the first and second flow-restricting surfaces each form a closed or semi-closed loop through which the radiation beam will pass in use.

4. The lithographic apparatus according to claim 1, further comprising a gas supply system to supply gas to an internal gaseous environment in the region of the patterning device, and wherein:

the lithographic apparatus is configured such that a flow of gas out of the internal gaseous environment passes through the gap between the first and second flow-restricting surfaces, and the first and/or second flow-restricting surfaces are configured such that the density of projections and/or recesses is lower in a region of the first and second flow-restricting surfaces through which the direction of flow of gas in use is on average more closely aligned with the certain direction than with a generally horizontal direction perpendicular to the certain direction in comparison with a region of the first and second flow-restricting surfaces through which the direction of flow of gas in use is on average more closely aligned with a generally horizontal direction perpendicular to the certain direction than with the certain direction.

5. The lithographic apparatus according to claim 1, wherein at least one projection and/or recess has a form that presents a larger resistance against gas flow in the generally horizontal direction perpendicular to the certain direction than against gas flow parallel to the certain direction.

6. The lithographic apparatus according to claim 1, wherein at least one projection and/or recess has an elongate form that is aligned with the certain direction.

7. The lithographic apparatus according to claim 1, wherein the height of at least one projection and/or a depth of at least one recess is greater than 2% of the mean average distance between the first and second flow-restricting surfaces.

8. The lithographic apparatus according to claim 1, wherein the first and second flow-restricting surfaces are substantially parallel to each other.

9. The lithographic apparatus according to claim 1, wherein the first and second flow-restricting surfaces comprise at least one projection and/or recess.

10. The lithographic apparatus according to claim 1, wherein:

at least one projection and/or recess is elongate, and the width of at least one region between adjacent elongate projections is larger than a height of adjacent elongate projections, or the width of at least one elongate recess is greater than the depth of the elongate recess.

11. The lithographic apparatus according to claim 1, wherein:

at least one projection and/or recess is elongate, the separation between the first and second flow-restricting surfaces is defined as the separation between the planes containing the points of closest approach in each of the first and second flow-restricting surfaces, and the width and/or height of at least one region between adjacent projections is larger than the separation between the first and second flow-restricting surfaces at at least a portion of the region, or the width and/or depth of at least one-recess is greater than the separation between the first and second flow-restricting surfaces at at least a portion of the recess.

12. The lithographic apparatus according to claim 1, wherein the first and/or second flow-restricting surface comprises a plurality of elongate projections in which the width of each of the elongate projections is smaller than the separation between directly adjacent elongate projections or in which the width of each of the elongate projections is greater than the separation between directly adjacent elongate projections.

13. The lithographic apparatus according to claim 1, wherein one of the first and second flow-restricting surfaces comprises a plurality of elongate projections that are each opposite to one of a plurality of recesses on the other of the first and second flow-restricting surfaces.

14. The lithographic apparatus according to claim 1, wherein the first and second flow-restricting surfaces are configured to limit inflow of gas into an internal gaseous environment through which the radiation beam passes in use after it has encountered the patterning device.

15. The lithographic apparatus according to claim 1, wherein the first and second flow-restricting surfaces are configured to limit inflow of gas into an internal gaseous environment through which the radiation beam passes in use before it has encountered the patterning device.

16. The lithographic apparatus according to claim 1, further comprising a further planar element comprising a further two flow-restricting surfaces, the further planar element being positioned between the first and second flow-restricting surfaces.

17. The lithographic apparatus according to claim 1, further comprising a gas supply system to supply gas to an internal gaseous environment in the region of the patterning device, wherein the lithographic apparatus is configured such that a flow of gas out of the internal gaseous environment passes through the gap between the first and second flow-restricting surfaces.

18. A lithographic apparatus comprising:

a support constructed to support a patterning device, the patterning device being capable of imparting a radiation beam with a pattern in its cross-section to form a patterned radiation beam, the support comprising a first planar element having a first flow-restricting surface;

a projection system configured to project the patterned radiation beam onto a target portion of a substrate;

a second planar element comprising a second flow-restricting surface facing the first flow-restricting surface;

a support driver to drive movement of the support relative to the second planar element; and a gas supply system configured to supply gas to an internal gaseous environment in the region of the patterning device, wherein the lithographic apparatus is configured such that a flow of gas out of the internal gaseous environment passes through a gap between the first and second flow-restricting surfaces, and the first and second flow-restricting surfaces are arranged to direct at least a portion of the flow of gas onto a component of the support driver that generates heat during use.

19. A device manufacturing method comprising:

supporting a patterning device using a support, the patterning device being capable of imparting a radiation beam with a pattern in its cross-section to form a patterned radiation beam, the support comprising a first planar element having a first generally horizontal flow-restricting surface;

moving the support and the first planar element relative to a second planar element, the second planar element comprising a second generally horizontal flow-restricting surface facing the first flow-restricting surface; and projecting the patterned radiation beam onto a target portion of a substrate, wherein the first flow-restricting surface, the second flow-restricting surface, or both the first and second flow-restricting surfaces, comprises a projection and/or recess in a gap between the first and second flow-restricting surfaces, wherein the support is moved linearly along a certain generally horizontal direction relative to the second planar element, and wherein the projection and/or recess on the first and/or second flow-restricting surface is arranged to provide a flow resistance, per unit width of the first and/or second flow-restricting surface perpendicular to a direction of flow, that is lower against flow that is parallel to the certain direction than against flow in a generally horizontal direction that is perpendicular to the certain direction.

20. A device manufacturing method comprising:

supporting a patterning device using a support, the patterning device being capable of imparting a radiation beam with a pattern in its cross-section to form a patterned radiation beam, the support comprising a first planar element having a first flow-restricting surface;

moving the support and the first planar element relative to a second planar element, the second planar element comprising a second flow-restricting surface facing the first flow-restricting surface;

supplying gas to an internal gaseous environment in the region of the patterning device;

using the first and second flow-restricting surfaces to direct a flow of gas out of the internal gaseous environment onto a component of a support driver that moves the support and that is generating heat; and projecting the patterned radiation beam onto a target portion of a substrate.

* * * * *